US012592548B1

(12) United States Patent
Hornung

(10) Patent No.: US 12,592,548 B1
(45) Date of Patent: Mar. 31, 2026

(54) VERTICALLY ORIENTED, MULTIPLE LASER DIODE BASED ILLUMINATION DEVICE

(71) Applicant: Luminus, Inc., Sunnyvale, CA (US)

(72) Inventor: Joseph A. Hornung, Cupertino, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 18/791,166

(22) Filed: Jul. 31, 2024

(51) Int. Cl.
| | |
|---|---|
| *H01S 5/40* | (2006.01) |
| *F21Y 107/40* | (2016.01) |
| *F21Y 107/50* | (2016.01) |
| *H01S 5/02255* | (2021.01) |
| *H01S 5/02315* | (2021.01) |
| *H01S 5/0239* | (2021.01) |
| *H01S 5/024* | (2006.01) |
| *H01S 5/042* | (2006.01) |

(52) U.S. Cl.
CPC ........ *H01S 5/4093* (2013.01); *H01S 5/02315* (2021.01); *H01S 5/0239* (2021.01); *H01S 5/02461* (2013.01); *H01S 5/04256* (2019.08); *F21Y 2107/40* (2016.08); *F21Y 2107/50* (2016.08); *H01S 5/02255* (2021.01); *H01S 5/4075* (2013.01)

(58) Field of Classification Search
CPC .. H01S 5/0239; H01S 5/0232; H01S 5/02315; H01S 5/4093; F21Y 2107/40; F21Y 2107/50
See application file for complete search history.

(56) References Cited

U.S. PATENT DOCUMENTS

| | | | |
|---|---|---|---|
| 2021/0172582 A1* | 6/2021 | Sissom | G02B 27/0172 |
| 2022/0149586 A1* | 5/2022 | Chen | F21V 9/30 |
| 2022/0166187 A1* | 5/2022 | Shi | H01S 5/0239 |
| 2022/0231484 A1* | 7/2022 | Igata | H01S 5/4093 |
| 2022/0360039 A1* | 11/2022 | Russell | H01S 5/4056 |

* cited by examiner

*Primary Examiner* — William N Harris
(74) *Attorney, Agent, or Firm* — Spano Law Group; Joseph S. Spano

(57) ABSTRACT

Methods and systems for integrating multiple, vertically oriented laser diode emitters into a low cost package suitable for high volume manufacturing are presented herein. Multiple laser diode based emitters are assembled on a mounting structure, which, in turn, is fixed to an insulated metal substrate. Each of the multiple laser diode based emitters are oriented such that the light output generated by each laser diode based emitter is aligned with a direction perpendicular to a mounting surface of the insulated metal substrate. In a further aspect, the insulated metal substrate includes electrically conductive layers disposed on the topside and backside of the thermally conductive metal core layer. Portions of the topside and backside electrical layers are electrically coupled such that the laser diode based illumination device is configured as a surface mount device amenable to low cost, surface mount, electronics manufacturing assembly processes.

20 Claims, 6 Drawing Sheets

200

201 ~ | GENERATE AN AMOUNT OF ILLUMINATION LIGHT FROM A LASER DIODE BASED ILLUMINATION DEVICE, THE LASER DIODE BASED ILLUMINATION DEVICE INCLUDING AN INSULATED METAL SUBSTRATE INCLUDING A THERMALLY CONDUCTIVE METAL CORE LAYER AND ONE OR MORE PATTERNED, ELECTRICALLY CONDUCTIVE METAL LAYERS DISPOSED OVER A FIRST SIDE OF THE THERMALLY CONDUCTIVE METAL CORE LAYER, A MOUNTING STRUCTURE HAVING A FIRST PLANAR SURFACE MECHANICALLY COUPLED TO THE FIRST SIDE OF THE THERMALLY CONDUCTIVE METAL CORE LAYER AND ONE OR MORE PLANAR SURFACES ORIENTED PERPENDICULAR TO THE FIRST PLANAR SURFACE, AND A PLURALITY OF LASER DIODE EMITTERS MECHANICALLY COUPLED TO AT LEAST ONE OF THE ONE OR MORE PLANAR SURFACES ORIENTED PERPENDICULAR TO THE FIRST PLANAR SURFACE, WHEREIN A DIRECTION OF LIGHT EMITTED FROM EACH OF THE PLURALITY OF LASER DIODE EMITTERS IS PERPENDICULAR TO THE FIRST PLANAR SURFACE OF THE MOUNTING STRUCTURE, AND WHEREIN AT LEAST ONE OF THE PLURALITY OF LASER DIODE EMITTERS IS ELECTRICALLY COUPLED TO A FIRST OF THE ONE OR MORE PATTERNED, ELECTRICALLY CONDUCTIVE METAL LAYERS DISPOSED OVER THE FIRST SIDE OF THE THERMALLY CONDUCTIVE METAL CORE LAYER

202 ~ | DIRECT LIGHT EMITTED FROM THE LASER DIODE BASED ILLUMINATION DEVICE TO A FOCAL PLANE BY AN OPTICS SUBSYSTEM

FIG. 8

VERTICALLY ORIENTED, MULTIPLE LASER DIODE BASED ILLUMINATION DEVICE

TECHNICAL FIELD

The described embodiments relate to illumination devices that include a Laser diode based illumination source.

BACKGROUND INFORMATION

Light emitting devices employing Light Emitting Diode (LED) illumination sources, Laser Diode (LD) illumination sources, or both, have achieved broad market penetration due to their electrical efficiency, long lifetime, high reliability, relatively low cost of manufacture, and physical scalability. Markets addressed by LED based light emitting devices include vehicle lighting, indoor and outdoor building lighting, display lighting, etc. In particular, LED based light emitting devices are rapidly replacing traditional illumination sources such as incandescent bulbs and fluorescent bulbs in general illumination applications.

In some industrial applications LEDs, LDs, or both, are employed at ultraviolet wavelengths to cure different materials, e.g., adhesives, etc. In these applications, relatively high optical power is required to meet throughput requirements of high volume processing equipment, e.g., semiconductor packaging applications. In many of these applications, industrial processing equipment is required to cure many different process materials, often at different wavelengths. Similarly, in some commercial applications, e.g., image projection systems, relatively high optical power is required over a broad range of wavelengths.

Unfortunately, as narrowband emitters, LEDs and LDs are not directly suited to illumination applications that require high power illumination at a number of different spectral bands or over a broad spectral band.

In some examples, one or more different illumination sources are selected to illuminate the workpiece under process as required by the process application. In some examples, the output of each different illumination source is independently controlled, e.g., switched on/off. In some examples, the output of each different illumination source is selectively directed to the workpiece under process or away from the workpiece under process by movement of an optical element of the optics system, e.g., a flip-in mirror, mechanical shutter, etc.

In some examples, several different discrete illumination sources, each emitting at different spectral bands, are employed. In some of these examples, an illumination device includes several single source, discrete packaged illumination sources integrated on one or more circuit boards. However, the etendue of one or more of the different illumination sources do not overlap because of the spatial separation between discrete packaged illumination sources. Thus, the optical path from one or more of the different illumination sources is not the same as other illumination sources. To overcome this limitation, the optical output of different illumination sources is optically combined using various discrete optical elements, e.g., mirrors, beam splitters, etc., located or selectively located in an optical path specific to a subset of the different illumination sources. In these examples, one or more optical elements do not interact with light output from all of the different illumination sources. This approach increases the cost and complexity of the optical system.

In an attempt to limit the spatial separation between LD based illumination sources, a discrete, LD based package incorporating multiple LDs has been developed, e.g., the QuaLas Module manufactured by Nichia Corporation (Japan). FIG. 1 is a diagram illustrative of a cross-sectional view of a multiple LD package 10 representative of the QuaLas Module manufactured by Nichia Corporation (Japan). As depicted in FIG. 1, multiple LD package 10 includes three LDs 15A-C mounted to submounts 14A-C, respectively. Submounts 14A-C are mounted to a surface 28 of copper mounting structure 11. As depicted in FIG. 1, the LDs 15A-C are mounted horizontally, i.e., the direction of the optical output of each LD is parallel to the surface 28 of mounting structure 11 upon which submounts 14A-C are mounted. LDs 15A-C generate output beams 29A-C, respectively. Output beams 29A-C are incident on prisms 16A-C, respectively. Prisms 16A-C redirect output beams 29A-C to a direction approximately perpendicular to surface 28 of mounting structure 11, toward output window 25 and lens structure 26. Lens structure 26 modifies the beam shape of output beams 29A-C to achieve the desired optical output 27 of multiple LD package 10. As depicted in FIG. 1, multiple LD package 10 includes ceramic wall structures 12 and 13. Ceramic wall structure 12 and 13 are brazed onto copper mounting structure 11. Similarly, window 25 is brazed onto ceramic wall structures 12 and 13. To facilitate electrical interconnections at the bottom of multiple LD package 10, relatively long conductors 18 and 20 are fabricated within insulated vias 17 and 19, respectively. As depicted in FIG. 1, wire bond conductor 21 electrically couples LD 15A to conductor 17, wire bond conductor 22 electrically couples LD 15B to submount 14A, wire bond conductor 23 electrically couples LD 15C to submount 14B, and wire bond conductor 24 electrically couples submount 14C to conductor 20. In this manner, LDs 14A-C are electrically coupled in series. Electrical conductors 18 and 20 are further coupled to a controlled current source (not shown) to drive electrical current through LDs 14A-C to generate illumination output 27.

Unfortunately, multiple LD package 10 suffers from a number of disadvantages. The use of prisms 16A-C to redirect output beams 29A-C, respectively, is problematic because each prism must be carefully aligned with respect to the corresponding LD to ensure predictable optical output characteristics of multiple LD package 10. Typically, this requires active measurement and alignment of each individual prism during the manufacturing process. This increases manufacturing complexity and cost of the multiple LD package. In addition, multiple LD package 10 requires brazing of the ceramic sidewalls 12 and 13 to copper mounting structure 11. This process is costly and complex as the copper mounting structure 11 is expensive, and the required fixturing to locate ceramic sidewalls 12 and 13 with respect to copper mounting structure 11 introduces undesirable cost and complexity to the manufacturing process. Finally, the insulated through vias 17 and 19 are costly to manufacture because of the length of the vias through ceramic structures 12 and 13.

Future applications require high power illumination employing laser diode based emitters at low cost. This presents challenges for current package designs. Thus, methods and systems for improved packaging of multiple laser diode emitters are desired.

SUMMARY

Methods and systems for integrating multiple, vertically oriented laser diode emitters into a low cost package suitable for high volume manufacturing are presented herein. Multiple laser diode based emitters are assembled on a mounting structure, which, in turn, is fixed to an insulated metal substrate. Each of the multiple laser diode based emitters are oriented such that the light output generated by each laser diode based emitter is aligned with a direction perpendicular to a mounting surface of the insulated metal substrate.

In one aspect, a laser diode based illumination device includes a mounting structure having a planar surface mechanically coupled to a top facing surface of a thermally conductive metal core layer and one or more planar laser diode mounting surfaces oriented perpendicular to the planar surface mechanically coupled to the thermally conductive metal core layer. Multiple laser diode emitter packages are mounted vertically to a mounting structure such that the direction of the optical output of each laser diode chip is perpendicular to the top facing surface of a thermally conductive metal core layer.

In a further aspect, an insulated metal substrate includes electrically conductive layers disposed on the topside and backside of a thermally conductive metal core layer. Portions of the topside and backside electrical layers are electrically coupled such that the laser diode based illumination device is configured as a surface mount device amenable to low cost, surface mount, electronics manufacturing assembly processes.

In general, a laser diode based illumination device may include laser diode emitter packages mounted to one or more LD mounting surfaces of one or more mounting structures.

In a further aspect, a laser diode based illumination device includes multiple laser diode emitters, each emitting light having peak intensity at a different wavelength. In some embodiments, the difference between the different peak wavelengths is at least one nanometer to avoid speckle, e.g., 1-3 nanometers. In some embodiments, the difference between the different peak wavelengths is at least 50 nanometers to generate a broadband illumination output.

In some embodiments, a laser diode based illumination device includes multiple laser diode emitters, each emitting light having peak intensity at different wavelengths in a range spanning from ultraviolet to infrared.

In some embodiments, a laser diode based illumination device includes multiple laser diode emitters, each emitting light having a peak intensity at different wavelengths in a range between 620 nanometers and 750 nanometers. In these embodiments, the laser diode based illumination device is a red light emitting illumination device. In further embodiments, a red light emitting LD based illumination device is assembled in combination with one or more LED based illumination devices emitting light in other ranges of the electromagnetic spectrum to generate broadband illumination.

In another further aspect, a laser diode based illumination device includes two or more sets of laser diode emitters. Each set includes multiple laser diode emitters electrically coupled in series. Furthermore, each set is electrically isolated from any other set of laser diode emitters comprising the laser diode based illumination device. Each set of multiple laser diode emitters is electrically addressable by a distinct set of electrical pads as described hereinbefore. Thus, each set of multiple laser diode emitters is configured as a separate illumination channel. In further embodiments, each separate illumination channel is electrically coupled to an independently controlled current source. In this manner, each illumination channel is independently controlled, i.e., the current flow through each illumination channel is independently controlled.

In some embodiments, illumination light generated by a laser diode based illumination device is collected by an optics subsystem and collimated or focused onto a focal plane. In some embodiments, the etendue of each of the illumination sources of the hybrid illumination device overlap over an area of a plane perpendicular to an optical path through the optics subsystem. In some other embodiments, the etendue of each of the illumination sources of the hybrid illumination device do not overlap.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

BRIEF DESCRIPTION OF THE DRAWINGS

FIG. 8 is a flowchart illustrative of a method for generating illumination light from a laser diode based illumination device of the present invention.

DETAILED DESCRIPTION

Reference will now be made in detail to background examples and some embodiments of the invention, examples of which are illustrated in the accompanying drawings.

Methods and systems for integrating multiple, vertically oriented laser diode emitters into a low cost package suitable for high volume manufacturing are presented herein. Multiple laser diode based emitters are assembled on a mounting structure, which, in turn, is fixed to an insulated metal substrate. Each of the multiple laser diode based emitters are oriented such that the light output generated by each laser diode based emitter is aligned with a direction perpendicular to a mounting surface of the insulated metal substrate. In this manner, optical mirrors or prisms are not required to redirect light emitted from each of the laser diode based emitters in the desired direction, away from the integrated laser diode package.

Figure 2:
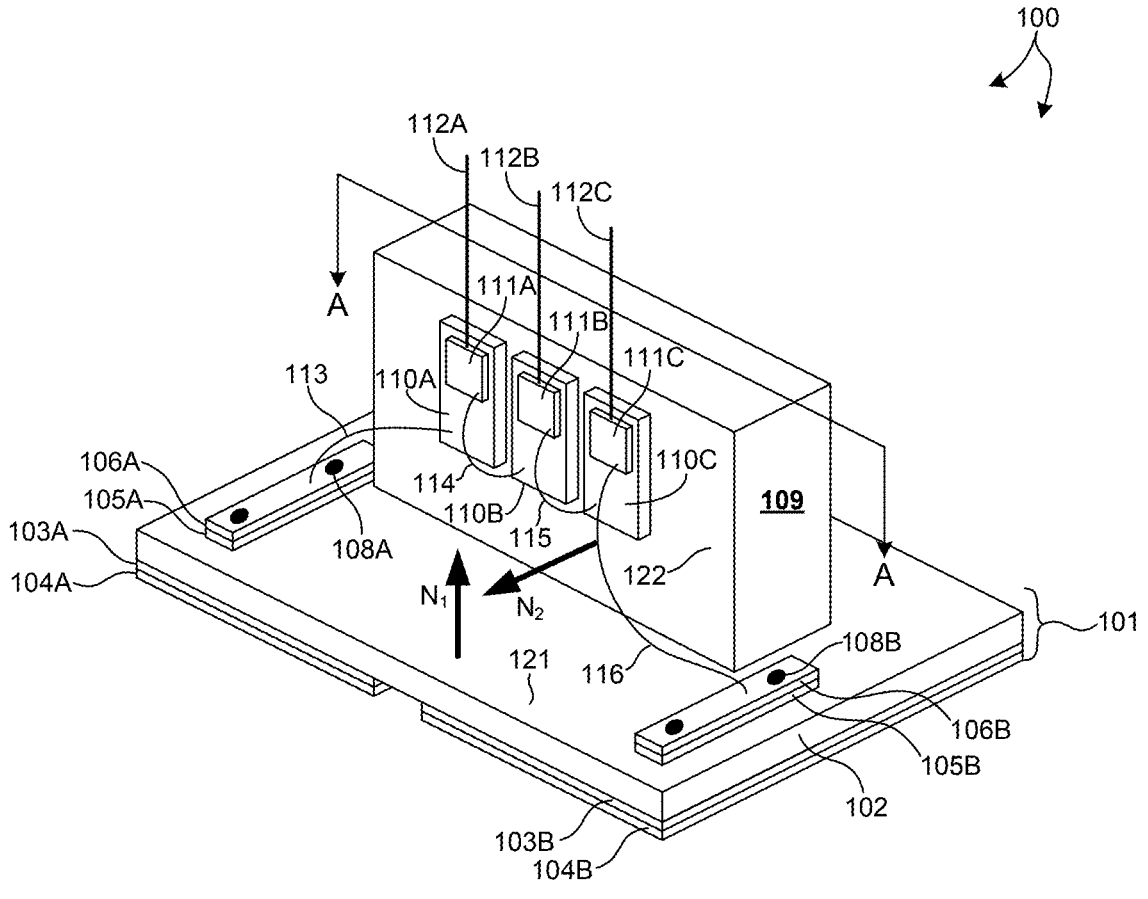
FIG. 2 is a simplified diagram illustrative of a perspective view of a laser diode based illumination device 100 in one embodiment.

FIG. 2 depicts a perspective view of a laser diode based illumination device 100 in one embodiment. As depicted in FIG. 2, laser diode based illumination device 100 includes insulated metal substrate 101, mounting structure 109, and three LDs 111A-C mounted to submounts 110A-C, respectively.

Insulated metal substrate 101 includes a thermally conductive metal core layer 102 and patterned, electrically conductive metal layers disposed over both sides of the thermally conductive metal core layer 102. In general, the thermally conductive metal core layer 102 is a relatively thick layer of thermally conductive material, e.g., copper, aluminum, etc. A patterned, electrically conductive metal layer is a relatively thin layer of electrically conductive material or combination of materials, e.g., copper, tin, silver, gold, etc. In some embodiments, the insulated metal substrate 101 is a metal-core printed circuit board (MC-PCB).

The patterned, electrically conductive layers are separated from the thermally conductive metal core layer 102 by dielectric layers disposed between each of the patterned, electrically conductive metal layers and the thermally conductive metal core layer 102. The dielectric layers are electrically insulative. In some embodiments, the insulated metal substrate is a metal-core printed circuit board (MC-PCB).

In one aspect, laser diode based illumination device 100 includes a mounting structure having a planar surface mechanically coupled to a top facing surface of the thermally conductive metal core layer and one or more planar laser diode mounting surfaces oriented perpendicular to the planar surface mechanically coupled to the thermally conductive metal core layer. As depicted in FIG. 2, thermally conductive metal core layer 102 includes a top-facing surface 121 upon which the bottom surface of mounting structure 109 is mechanically coupled, e.g., by brazing, gold/tin soldering, etc. In addition, mounting structure 109 includes a laser diode mounting surface 122, which is perpendicular to top-facing surface 121. In other words, surface normal, $N_1$, which is normal to the surface of top-facing surface 121, is oriented perpendicular to surface normal, $N_2$, which is normal to the surface of laser diode mounting surface 122.

As depicted in FIG. 2, submounts 110A-C are mounted to laser diode mounting surface 122 of mounting structure 109. As depicted in FIG. 2, output beams 112A-C are the optical output of laser diode chips 111A-C, respectively. Laser diodes 111A-C are mounted vertically, i.e., the direction of the optical output of each laser diode chip is perpendicular to the surface 121 of thermally conductive metal core layer 109 and parallel to the surface 122 of mounting structure 109. Analogously, the direction of the optical output of each laser diode chip is perpendicular to surface normal, $N_2$, and parallel to surface normal, $N_1$.

As illustrated in FIG. 2, insulated metal substrate 101 includes an electrically conductive layer patterned into two spatially separated electrical pads 106A and 106B. Electrical pads 106A and 106B are electrically isolated from thermally conductive metal core layer 102 by a dielectric layer patterned into two spatially separated portions 105A and 105B, matching electrical pads 106A and 106B, respectively.

As depicted in FIG. 2, electrical pad 106A is electrically coupled to LD submount 110A by wire bond 113. Laser diode chip 111A is electrically coupled to LD submount 110B by wire bond 114. Laser diode chip 111B is electrically coupled to LD submount 110C by wire bond 115. Laser diode chip 111C is electrically coupled to electrical pad 106B by wire bond 116. As such, laser diode chips 110A-C are electrically coupled in series. Electrical pads 106A and 106B are electrically isolated from one another and an electrical current is driven through LD chips 111A-C via voltage difference maintained between electrical pads 106A and 106B. The electrical current induces light emission from LD chips 111A-C.

In a further aspect, insulated metal substrate 101 includes at least one other electrically conductive layer disposed on the opposite side, i.e., the backside, of thermally conductive metal core layer 102. Portions of the topside and backside electrical layers are electrically coupled such that the laser diode based illumination device is configured as a surface mount device amenable to low cost, surface mount, electronics manufacturing assembly processes.

Figure 3:
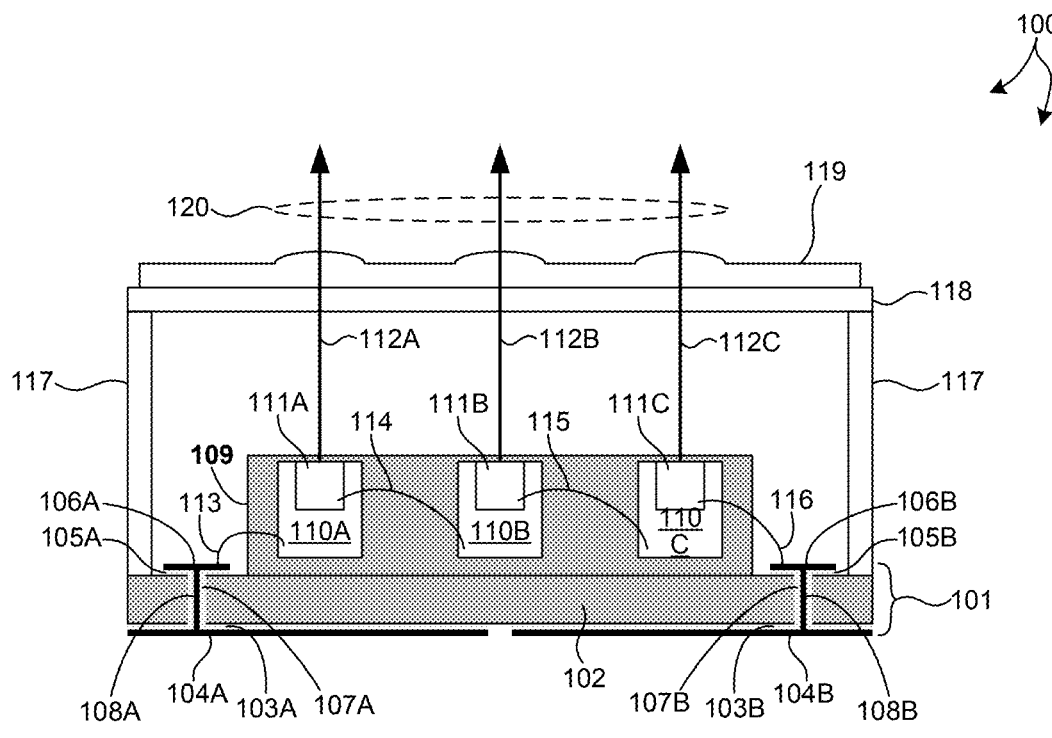
FIG. 3 is a simplified diagram illustrative of a cross-sectional view of laser diode based illumination device 100 corresponding to section line A-A depicted in FIG. 2.

As depicted in FIGS. 2 and 3, the backside electrically conductive layer is patterned into two spatially separated electrical pads 104A and 104B. Electrical pads 104A and 104B are electrically isolated from thermally conductive metal core layer 102 by a dielectric layer patterned into two spatially separated portions 103A and 103B, matching electrical pads 104A and 104B, respectively. To facilitate electrical interconnections at the bottom of laser diode based illumination device 100, conductors 108A and 108B are fabricated within insulated vias 107A and 107B, respectively. In this manner, electrical pad 106A is electrically coupled to electrical pad 104A by an insulated, filled via, and electrical pad 106B is electrically coupled to electrical pad 104B by another insulated, filled via.

Figure 1:
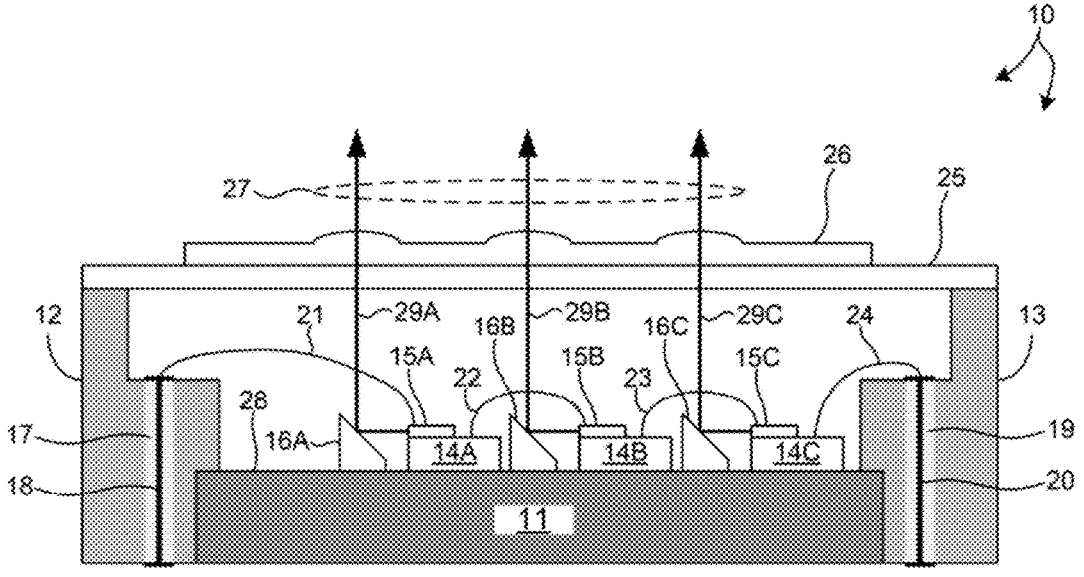
FIG. 1 is a diagram illustrative of a cross-sectional view of a multiple LD package 10 representative of the QuaLas Module manufactured by Nichia Corporation (Japan).

As illustrated in FIGS. 2 and 3, the insulated, filled vias employed to electrically couple topside electrical pads to backside electrical pads are relatively short compared to the device depicted in FIG. 1. Employing electrical interconnects through the insulated metal substrate, rather than the ceramic wall structure, enables much shorter conductor lengths. In addition, fabrication of electrical interconnects through a standard insulated metal substrate, such as a metal-core printed circuit board (MC-PCB) may be performed at a much lower cost than fabrication of electrical interconnects through a custom fabricated ceramic wall structure.

FIG. 3 is a cross-sectional view of laser diode based illumination device 100 corresponding to section line A-A depicted in FIG. 2. As depicted in FIG. 3, laser diode based illumination device 100 includes wall structure 117, output window 118, and lens structure 119. These elements are depicted in FIG. 3, but not FIG. 2 to avoid overly cluttering the illustration of FIG. 2.

As depicted in FIG. 3, a bottom facing surface of wall structure 117 is mechanically coupled to the thermally conductive metal core layer 102, e.g., by brazing, gold/tin solder, low melting point glass solder, etc. Similarly, output window 118 is mechanically coupled to a top facing surface of wall structure 117, e.g. by brazing, gold/tin solder, low melting point glass solder, etc.

In some embodiments, wall structure 117 is fabricated from a ceramic material, thermally conductive metal core layer 102 is fabricated from copper, and output window 118 fabricated from sapphire, quartz, glass, etc.

In some embodiments, wall structure 117 is fabricated from a thermally conductive metal, e.g., copper, aluminum, etc. In some of these embodiments, wall structure 117 is coupled to thermally conductive metal core layer by a soldering, brazing, or welding process.

In some embodiments, wall structure 117 is fabricated from a plastic material or a thermally conductive plastic material, e.g., thermally conductive particles suspended in a plastic matrix material, etc. In some of these embodiments, wall structure 117 is coupled to thermally conductive metal core layer by a welding process.

In some embodiments, wall structure 117 is an assembly including multiple walls, e.g., four walls arranged in a square or rectangular shape, three walls arranged in a triangular shape, one wall arranged in a circular or elliptical shape, etc.

As depicted in FIGS. 2 and 3, output beams 112A-C are emitted from laser diode chips 111A-C, respectively, in a direction approximately perpendicular to surface 121 of insulated metal substrate 121, toward output window 118 and lens structure 119. Lens structure 119 modifies the beam shape of output beams 112A-C to achieve the desired optical output 120 of laser diode based illumination device 100.

In the embodiments depicted in FIGS. 2 and 3, each of the laser diode emitters is electrically isolated, i.e., the surface of the laser diode die or package mounted to the mounting structure is not electrically active. However, in some other embodiments, a laser diode emitter package that is not electrically isolated may be employed. In one example, the submount of the laser diode emitter package is an electrical terminal and current flows through the electrical submount and into the mounting structure upon which the submount is mechanically coupled. In general, both electrically isolated and non-isolated laser diode emitter configurations may be contemplated within the scope of this patent document.

In general, the insulated metal substrate mechanically and electrically interfaces the laser diode emitters with the application environment in which laser diode based illumination source is installed. The electrically isolated mounting surface of each laser diode emitter package, e.g., the submounts depicted in FIGS. 2 and 3, does not participate in the electrical circuit driving current through the laser diode emitters. Thus, the coupling of the backside surface of the laser diode emitter package to mounting structure 109 is optimized for thermal performance without consideration of electrical performance. For example, a thermally conductive paste is selected to be as thermally conductive as possible without regard for electrical resistance because no particular electrical isolation or conductivity is required at the interface between the laser diode emitter package and the mounting structure 109.

However, in some embodiments, one or more laser diode based illumination sources are not electrically isolated. In these embodiments, the mounting structure and the thermally conductive metal core layer of the insulated metal substrate is part of the electrical circuit driving current through the one or more laser diode devices, e.g., the thermally conductive metal core layer is a ground plane in an electrical circuit including the one or more laser diode devices.

In the embodiments depicted in FIGS. 2 and 3, each laser diode emitter package includes a laser diode chip and a submount configured in a chip-on-submount package. However, in general, any suitable laser diode emitter configuration may be contemplated within the scope of this patent document.

In general, the laser diode illumination devices described herein are configured to accommodate relatively high power laser diodes. In some embodiments, the optical output power of each laser diode emitter is at least 2.0 Watts. However, in general, laser diode emitters configured with any suitable optical output power may be contemplated within the scope of this patent document.

In some embodiments, a laser diode emitter package includes a photodiode optically coupled to the laser diode emitter. The photodiode generates an electrical signal indicative of an optical output power of the laser diode emitter. In these embodiments, the electrical signal is communicated to a controller to control the current flow through the laser diode emitter, and thus the optical output of the laser diode emitter. In these embodiments, insulated metal substrate 101 includes another topside electrical pad electrically coupled to the photodiode, and a corresponding bottom side electrical pad electrically coupled to the topside electrical pad to communicate the output signal generated by the photodiode to the bottom of the laser diode illumination device. In these embodiments, the surface mount package includes electrical pads associated with each laser diode circuit and electrical pads associated with each photodiode feedback signal employed to control the current flow through each laser diode circuit.

In the embodiment described with reference to FIGS. 2 and 3, laser diode emitter packages are mounted to a single surface 122 of a single mounting structure 109. However, in general, a laser diode based illumination device may include laser diode emitter packages mounted to one or more LD mounting surfaces of one or more mounting structures.

Figure 4:
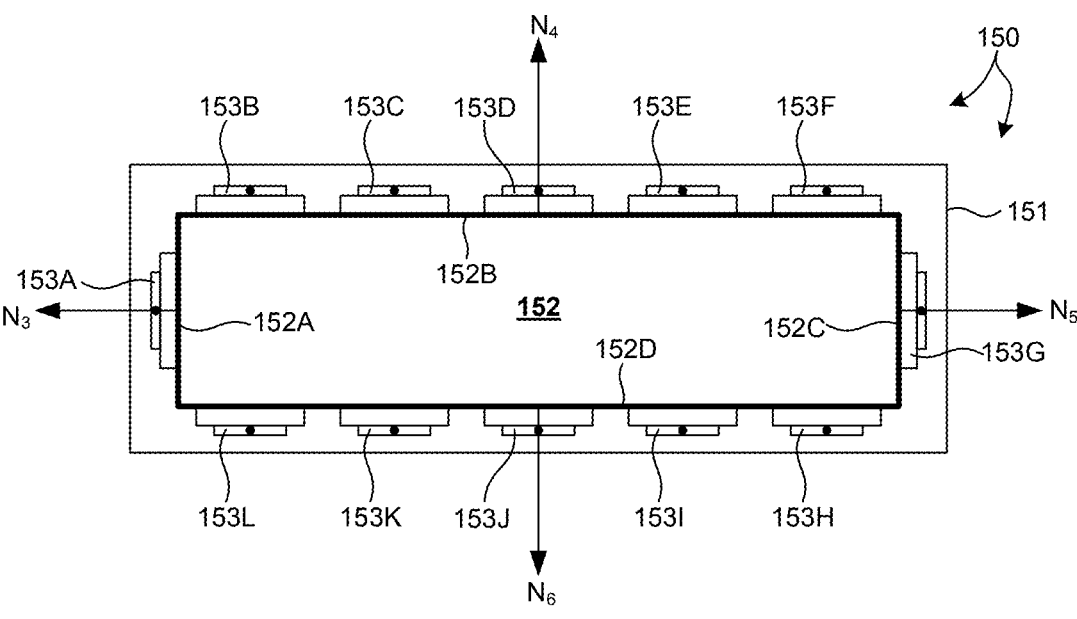
FIG. 4 is a simplified diagram illustrative of a laser diode based illumination device in another embodiment.

FIG. 4 is a simplified diagram illustrative of a top view of a laser diode based illumination device 150 including laser diode emitter packages 153A-L mounted to four LD mounting surfaces of a mounting structure 152. More specifically, laser diode emitter package 153A is mounted to LD mounting surface 152A, laser diode emitter packages 153B-F are mounted to LD mounting surface 152B, laser diode emitter package 153G is mounted to LD mounting surface 152C, and laser diode emitter packages 153H-L are mounted to LD mounting surface 152D.

As depicted in FIG. 4, a mounting structure 152 is mechanically coupled to a topside surface of thermally conductive metal core layer 151. The direction normal to the topside surface of thermally conductive metal core layer 151 extends perpendicular to the drawing page. As depicted in FIG. 4, mounting structure 152 includes four LD mounting surfaces 152A-D. Surface normals, $N_3$-$N_6$, correspond to surfaces 152A-D, respectively. The direction of each of surface normals $N_3$-$N_6$, is perpendicular to the direction normal to the topside surface of thermally conductive metal core layer 151. Analogously, the direction of each of surface normals $N_3$-$N_6$, is parallel to the topside surface of thermally conductive metal core layer 151. Furthermore, the output beam associated with each of laser diode emitter packages 153A-L extends in a direction perpendicular to the drawing page. The output beam associated with each of the laser diode emitter packages 153A-L is represented by a small dot. As such, the output beam associated with each of laser diode emitter packages 153A-L extends in a direction perpendicular to the direction normal to the topside surface of thermally conductive metal core layer 151.

Figure 5:
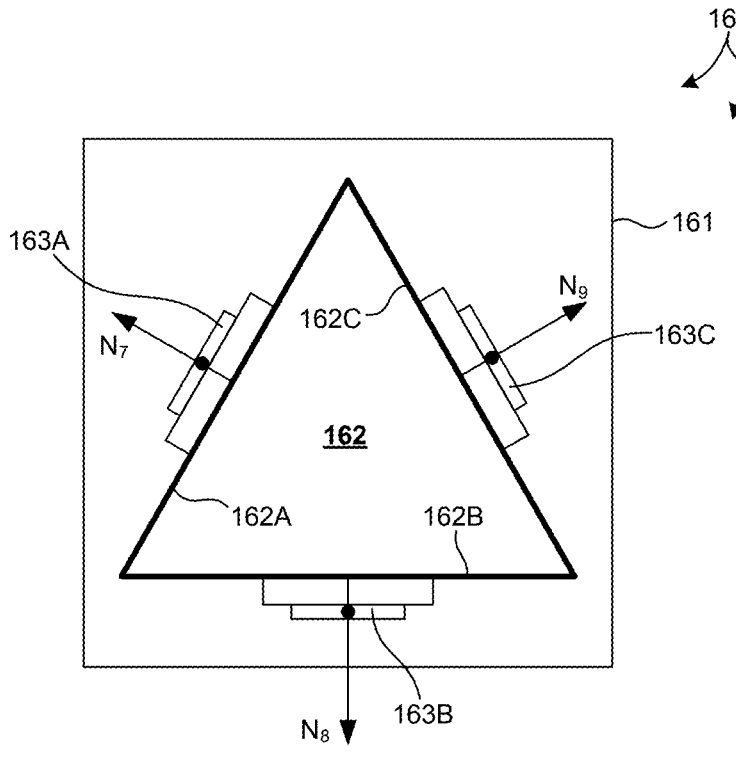
FIG. 5 is a simplified diagram illustrative of a laser diode based illumination device in another embodiment.

FIG. 5 is a simplified diagram illustrative of a top view of a laser diode based illumination device 160 including laser diode emitter packages 163A-C mounted to three LD mounting surfaces of a mounting structure 162. More specifically, laser diode emitter package 153A is mounted to LD mounting surface 162A, laser diode emitter package 163B is mounted to LD mounting surface 162B, and laser diode emitter package 163C is mounted to LD mounting surface 162C.

As depicted in FIG. 5, a mounting structure 162 is mechanically coupled to a topside surface of thermally conductive metal core layer 161. The direction normal to the topside surface of thermally conductive metal core layer 161 extends perpendicular to the drawing page. As depicted in FIG. 5, mounting structure 162 includes three LD mounting surfaces 162A-D. Surface normals, $N_7$-$N_9$, correspond to surfaces 162A-C, respectively. The direction of each of surface normals $N_7$-$N_9$, is perpendicular to the direction normal to the topside surface of thermally conductive metal core layer 161. Analogously, the direction of each of surface normals $N_7$-$N_9$, is parallel to the topside surface of thermally conductive metal core layer 161. Furthermore, the output beam associated with each of laser diode emitter packages 163A-C extends in a direction perpendicular to the drawing page. The output beam associated with each of the laser diode emitter packages 163A-C is represented by a small dot. As such, the output beam associated with each of laser diode emitter packages 163A-C extends in a direction perpendicular to the direction normal to the topside surface of thermally conductive metal core layer 161.

Figure 6:
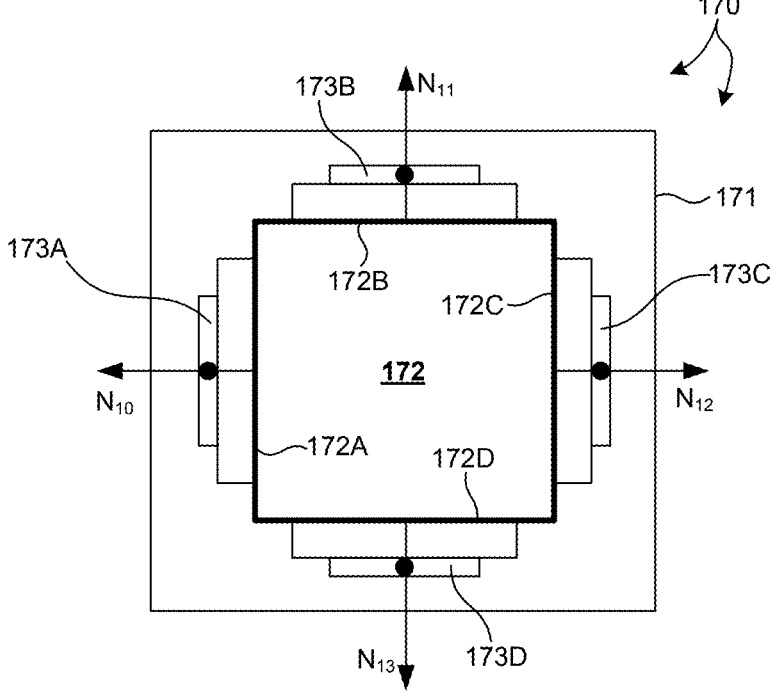
FIG. 6 is a simplified diagram illustrative of a laser diode based illumination device in another embodiment.

FIG. 6 is a simplified diagram illustrative of a top view of a laser diode based illumination device 170 including laser diode emitter packages 173A-D mounted to four LD mounting surfaces of a mounting structure 172. More specifically, laser diode emitter package 173A is mounted to LD mounting surface 172A, laser diode emitter package 173B is mounted to LD mounting surface 172B, laser diode emitter package 173C is mounted to LD mounting surface 172C, and laser diode emitter package 173D is mounted to LD mounting surface 172D.

As depicted in FIG. 6, a mounting structure 172 is mechanically coupled to a topside surface of thermally conductive metal core layer 171. The direction normal to the topside surface of thermally conductive metal core layer 171 extends perpendicular to the drawing page. As depicted in FIG. 6, mounting structure 172 includes three LD mounting surfaces 172A-D. Surface normals, $N_{10}$-$N_{13}$, correspond to surfaces 172A-D, respectively. The direction of each of surface normals $N_{10}$-$N_{13}$, is perpendicular to the direction normal to the topside surface of thermally conductive metal core layer 171. Analogously, the direction of each of surface normals $N_{10}$-$N_{13}$, is parallel to the topside surface of thermally conductive metal core layer 171. Furthermore, the output beam associated with each of laser diode emitter packages 173A-D extends in a direction perpendicular to the drawing page. The output beam associated with each of the laser diode emitter packages 133A-D is represented by a small dot. As such, the output beam associated with each of laser diode emitter packages 173A-D extends in a direction perpendicular to the direction normal to the topside surface of thermally conductive metal core layer 171.

The embodiments depicted in FIGS. 2-6 are provided by way of non-limiting example. In general, a laser diode based illumination device may include any number of laser diode emitter packages mounted to any number of LD mounting surfaces of any number of mounting structures coupled to a thermally conductive metal core layer.

In a further aspect, a laser diode based illumination device includes multiple laser diode emitters, each emitting light having a peak intensity at a different wavelength. In some embodiments, the difference between the different peak wavelengths is at least one nanometer to avoid speckle, e.g., 1-3 nanometers. In some embodiments, the difference between the different peak wavelengths is at least 50 nanometers to generate a broadband illumination output.

In some embodiments, a laser diode based illumination device includes multiple laser diode emitters, each emitting light having peak intensity at different wavelengths in a range spanning from ultraviolet to infrared. In some examples, a laser diode based illumination device includes multiple laser diode emitters, each emitting light having peak intensity at different wavelengths in a range between 365 nanometers and 1,000 nanometers. In these embodiments, the laser diode based illumination device is a broadband illumination device, e.g., suitable for curing a range of different industrial materials.

In some embodiments, a laser diode based illumination device includes multiple laser diode emitters, each emitting light having a peak intensity at different wavelengths in a range between 620 nanometers and 750 nanometers. In these embodiments, the laser diode based illumination device is a red light emitting illumination device. In further embodiments, a red light emitting LD based illumination device is assembled in combination with one or more LED based illumination devices emitting light in other ranges of the electromagnetic spectrum to generate broadband illumination.

In another further aspect, a laser diode based illumination device includes two or more sets of laser diode emitters. Each set includes multiple laser diode emitters electrically coupled in series. Furthermore, each set is electrically isolated from any other set of laser diode emitters comprising the laser diode based illumination device. Each set of multiple laser diode emitters is electrically addressable by a distinct set of electrical pads as described hereinbefore. Thus, each set of multiple laser diode emitters is configured as a separate illumination channel. In further embodiments, each separate illumination channel is electrically coupled to an independently controlled current source. In this manner, each illumination channel is independently controlled, i.e., the current flow through each illumination channel is independently controlled.

In some embodiments, the output light emitted from laser diode emitters comprising each separate illumination channel has a different peak wavelength. In this manner, the color of light emitted from a laser diode based illumination device can be controlled based on the current supplied to each separate channel. In some examples, a laser diode based illumination device includes three independently controllable illumination channels, one having a peak wavelength in a blue portion of the visible spectrum, another having a peak wavelength in a green portion of the visible spectrum, and another having a peak wavelength in a red portion of the visible spectrum. In these examples, the color of light emitted from the laser diode based illumination device can be controlled to emit broadband illumination over a broad range of the visible spectrum.

In embodiments employing a multiple layer MC-PCB, multiple electrically conductive metal layers are disposed over a thermally conductive metal core layer in a stacked configuration. In these embodiments, a dielectric layer is disposed between each of the electrically conductive metal layers and the thermally conductive metal core layer in the stack.

In some embodiments, a laser diode based illumination device includes a multiple layer MC-PCB. In some of these embodiments, the electrical traces electrically coupled to one of more laser diode based illumination sources are patterned from a different electrically conductive metal layer than the electrical traces electrically coupled to other LD based illumination sources of the laser diode based illumination device.

In some embodiments, a LD based illumination source of a laser diode based illumination device is a packaged LD illumination source. In some other embodiments, a LD based illumination source of a laser diode based illumination device is a bare LD chip.

Figure 7:
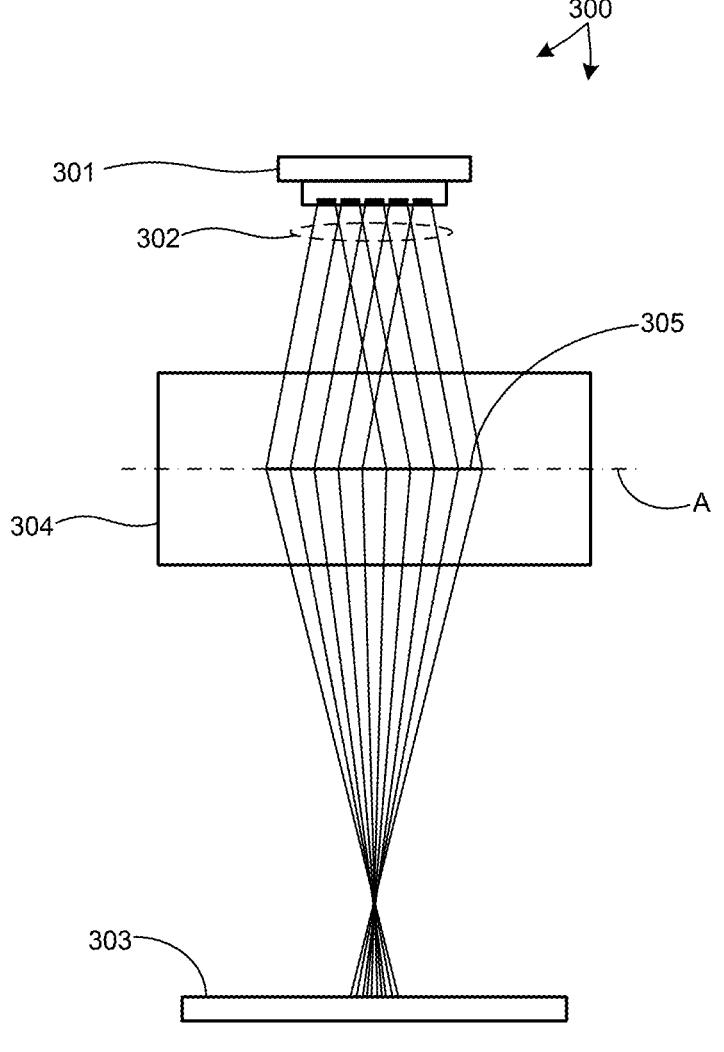
FIG. 7 is a simplified diagram illustrative of an illumination system including a laser diode based illumination device and an optics subsystem.

FIG. 7 depicts a simplified illustration of an illumination system 300 including a laser diode based illumination device 301 and an optics subsystem 304. As depicted in FIG. 7, illumination light 302 generated by laser diode based illumination device 301 is collected by optics subsystem 304 and collimated or focused onto focal plane 303. Each of the illumination sources share a common optical path through optics subsystem 304 from the laser diode based illumination device 301 to focal plane 303. In this manner, the optical output of any combination of the illumination sources of the laser diode based illumination device is projected onto the focal plane using the same optical elements in the same configuration. In this manner, the laser diode based illumination device is able to illuminate an object using any combination of illumination sources using the same optical elements, without reconfiguring the optical system. In some examples, optical subsystem 304 includes a single focusing optical element, e.g., a refractive objective. In some other examples, multiple optical elements, e.g. mirrors, may be employed to collect illumination light 302 and collimate or focus illumination light 302 onto focal plane 303. In some embodiments, the etendue of each of the illumination sources of the hybrid illumination device overlap over an area 305 of plane A. Plane A is a plane perpendicular to an optical path through the optics subsystem 304. In some other embodiments, the etendue of each of the illumination sources of the hybrid illumination device do not overlap.

FIG. 8 illustrates a method 200 suitable for implementation by a laser diode based illumination device of the present invention. While the following description is presented in the context of laser diode based illumination device 100, it is recognized herein that the particular structural aspects of laser diode based illumination device 100 does not represent limitations and should be interpreted as illustrative only.

In block 201, an amount of illumination light is generated from a laser diode based illumination device. The laser diode based illumination device includes an insulated metal substrate including a thermally conductive metal core layer and one or more patterned, electrically conductive metal layers disposed over a first side of the thermally conductive metal core layer, a mounting structure having a first planar surface mechanically coupled to the first side of the thermally conductive metal core layer and one or more planar surfaces oriented perpendicular to the first planar surface, and a plurality of laser diode emitters mechanically coupled to at least one of the one or more planar surfaces oriented perpendicular to the first planar surface. A direction of light emitted from each of the plurality of laser diode emitters is perpendicular to the first planar surface of the mounting structure. At least one of the plurality of laser diode emitters is electrically coupled to a first of the one or more patterned, electrically conductive metal layers disposed over the first side of the thermally conductive metal core layer.

In block 202, light emitted from the laser diode based illumination device is directed to a focal plane by an optics subsystem.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A laser diode based illumination device comprising:
an insulated metal substrate including a thermally conductive metal core layer, one or more patterned, electrically conductive metal layers disposed over a first side of the thermally conductive metal core layer, and one or more dielectric layers disposed between the one or more patterned, electrically conductive metal layers, disposed between the thermally conductive metal core layer and a patterned, electrically conductive metal layer of the one or more patterned, electrically conductive layers, or both, wherein the one or more dielectric layers are electrically insulative;
a mounting structure having a first planar surface mechanically coupled to the first side of the thermally conductive metal core layer and one or more planar surfaces oriented perpendicular to the first planar surface; and
a plurality of laser diode emitters mechanically coupled to at least one of the one or more planar surfaces oriented perpendicular to the first planar surface, wherein a direction of light emitted from each of the plurality of laser diode emitters is perpendicular to the first planar surface of the mounting structure, wherein at least one of the plurality of laser diode emitters is electrically coupled to a first of the one or more patterned, electrically conductive metal layers disposed over the first side of the thermally conductive metal core layer.

2. The laser diode based illumination device of claim 1, the insulated metal substrate further comprising:
a second electrically conductive metal layer disposed over a second side of the thermally conductive metal core layer opposite the first side of the thermally conductive metal core layer;
a second dielectric layer disposed between the second patterned, electrically conductive metal layer and the thermally conductive metal core layer; and
an insulated, filled via that electrically couples the first of the one or more patterned, electrically conductive metal layers disposed over the first side of the thermally conductive metal core layer and the second electrically conductive metal layer.

3. The laser diode based illumination device of claim 1, further comprising:
at least one wall structure having a first surface mechanically coupled to the thermally conductive metal core layer; and
an output window mechanically coupled to a second surface of the at least one wall structure.

4. The laser diode based illumination device of claim 1, further comprising:
a photodiode optically coupled to a first of the plurality of laser diode emitters, the photodiode configured to generate an electrical signal indicative of an optical output power of the first laser diode emitter.

5. The laser diode based illumination device of claim 1, wherein a surface of each of the plurality of laser diode emitters mechanically coupled to the one or more planar surfaces of the mounting structure is electrically inactive.

6. The laser diode based illumination device of claim 1, wherein each of the plurality of laser diode emitters includes a laser diode chip and a submount configured in a chip-on-submount package.

7. The laser diode based illumination device of claim 1, the mounting structure having a second planar surface oriented perpendicular to the first planar surface and a third planar surface oriented perpendicular to the first planar surface, wherein the second and third planar surfaces are not coplanar, wherein a first of the plurality of laser diode emitters is disposed over the second planar surface and a second of the plurality of laser diode emitters is disposed over the third planar surface.

8. The laser diode based illumination device of claim 1, wherein the insulated metal substrate is a metal-core printed circuit board (MC-PCB).

9. The laser diode based illumination device of claim 1, wherein a first of the plurality of laser diode emitters emits light having peak intensity at a first wavelength and a second of the plurality of laser diode emitters emits light having peak intensity at a second wavelength different from the first wavelength.

10. The laser diode based illumination device of claim 9, wherein a difference between the first and second wavelengths is at least 1 nanometer.

11. The laser diode based illumination device of claim 9, wherein a difference between the first and second wavelengths is at least 50 nanometers.

12. The laser diode based illumination device of claim 1, wherein each of the plurality of laser diode emitters emits light having peak intensity at different wavelengths in a range between 365 nanometers and 1,000 nanometers.

13. The laser diode based illumination device of claim 1, wherein an optical output power of each of the plurality of laser diode emitters is at least 2.0 Watts.

14. The laser diode based illumination device of claim 1, wherein the plurality of laser diode emitters are electrically coupled in series.

15. The laser diode based illumination device of claim 1, wherein a first plurality of the plurality of laser diode emitters are electrically coupled in series as a first channel and a second plurality of the plurality of laser diode emitters are electrically coupled in series as a second channel, and wherein the first and second channels are electrically isolated from one another.

16. The laser diode based illumination device of claim 15, wherein a peak wavelength of light emitted from the first plurality of the plurality of laser diode emitters is different from a peak wavelength of light emitted from the second plurality of the plurality of laser diode emitters.

17. The laser diode based illumination device of claim 16, wherein a current flow through the first channel is controlled independently from a current flow through the second channel.

18. A laser diode based illumination system comprising:
a laser diode based illumination device comprising:
an insulated metal substrate including a thermally conductive metal core layer, one or more patterned, electrically conductive metal layers disposed over a first side of the thermally conductive metal core layer, and one or more dielectric layers disposed between the one or more patterned, electrically conductive metal layers, disposed between the thermally conductive metal core layer and a patterned, electrically conductive metal layer of the one or more patterned, electrically conductive layers, or both, wherein the one or more dielectric layers are electrically insulative;

a mounting structure having a first planar surface mechanically coupled to the first side of the thermally conductive metal core layer and one or more planar surfaces oriented perpendicular to the first planar surface;
a plurality of laser diode emitters mechanically coupled to at least one of the one or more planar surfaces oriented perpendicular to the first planar surface, wherein a direction of light emitted from each of the plurality of laser diode emitters is perpendicular to the first planar surface of the mounting structure, wherein at least one of the plurality of laser diode emitters is electrically coupled to a first of the one or more patterned, electrically conductive metal layers disposed over the first side of the thermally conductive metal core layer; and
an optics subsystem configured to direct light emitted from the laser diode based illumination device to a focal plane.

19. The laser diode based illumination system of claim 18, further comprising:
at least one wall structure having a first surface mechanically coupled to the thermally conductive metal core layer; and
an output window mechanically coupled to a second surface of the at least one wall structure.

20. A method comprising:
generating an amount of illumination light from a laser diode based illumination device, the laser diode based illumination device including an insulated metal substrate including a thermally conductive metal core layer and one or more patterned, electrically conductive metal layers disposed over a first side of the thermally conductive metal core layer, a mounting structure having a first planar surface mechanically coupled to the first side of the thermally conductive metal core layer and one or more planar surfaces oriented perpendicular to the first planar surface, and a plurality of laser diode emitters mechanically coupled to at least one of the one or more planar surfaces oriented perpendicular to the first planar surface, wherein a direction of light emitted from each of the plurality of laser diode emitters is perpendicular to the first planar surface of the mounting structure, and wherein at least one of the plurality of laser diode emitters is electrically coupled to a first of the one or more patterned, electrically conductive metal layers disposed over the first side of the thermally conductive metal core layer; and
directing light emitted from the laser diode based illumination device to a focal plane by an optics subsystem.

* * * * *